United States Patent
Ricci et al.

(10) Patent No.: US 9,865,756 B2
(45) Date of Patent: *Jan. 9, 2018

(54) METHOD FOR MANUFACTURING A THIN-LAYER PHOTOVOLTAIC DEVICE, IN PARTICULAR FOR SOLAR GLAZING

(71) Applicant: CROSSLUX, Rousset (FR)

(72) Inventors: Marc Ricci, Marseilles (FR); Pierre-Yves Thoulon, Le Tholonet (FR); Ivan Jager, Aix en Provence (FR)

(73) Assignee: CROSSLUX, Rousset (FR)

(*) Notice: Subject to any disclaimer, the term of this patent is extended or adjusted under 35 U.S.C. 154(b) by 0 days.

This patent is subject to a terminal disclaimer.

(21) Appl. No.: 14/437,688

(22) PCT Filed: Oct. 22, 2013

(86) PCT No.: PCT/FR2013/052523
§ 371 (c)(1),
(2) Date: Apr. 22, 2015

(87) PCT Pub. No.: WO2014/064382
PCT Pub. Date: May 1, 2014

(65) Prior Publication Data
US 2015/0287859 A1    Oct. 8, 2015

(30) Foreign Application Priority Data
Oct. 23, 2012 (FR) .......................... 12 60068

(51) Int. Cl.
*H01L 31/04* (2014.01)
*H01L 31/0468* (2014.01)
(Continued)

(52) U.S. Cl.
CPC ...... *H01L 31/0468* (2014.12); *H01L 31/0216* (2013.01); *H01L 31/0504* (2013.01); *H01L 31/18* (2013.01); *Y02E 10/50* (2013.01)

(58) Field of Classification Search
CPC ........................ H01L 31/0216; H01L 31/0468
See application file for complete search history.

(56) References Cited

U.S. PATENT DOCUMENTS

| 4,795,500 A | 1/1989 | Kishi et al. |
| 4,948,740 A * | 8/1990 | Plaettner .............. H01L 31/043 136/244 |

(Continued)

FOREIGN PATENT DOCUMENTS

| EP | 1638150 A2 | 3/2006 |
| GB | 2446838 A | 8/2008 |
| JP | 2000223727 A | 8/2000 |

OTHER PUBLICATIONS

Takeoka et al.,"Development and Application of See-Through A-Si Solar Cells", Solar Energy Materials and Solar Cells, Elservier Science Publishers, Amsterdam, NL, vol. 29, No. 3, Apr. 1, 1993, pp. 243-252.

(Continued)

*Primary Examiner* — Caridad Everhart
*Assistant Examiner* — Ankush Singal
(74) *Attorney, Agent, or Firm* — Cantor Colburn LLP

(57) ABSTRACT

A method for producing a thin-film photovoltaic device (1), comprising the following steps: providing a substrate (2); placing a photovoltaic film (3) on said substrate by stacking layers comprising at least a first conductive layer (4) forming a rear electrical contact, a second photoactive layer (5) that is absorbent in the solar spectrum and is made from an inorganic material, and a third layer (6) made from a transparent conductive material forming a front electrical contact; —dividing the photovoltaic film into a plurality of (Continued)

individual and interconnected photovoltaic cells (30),
—forming a plurality of individual holes (31) passing at least through the first and second layers of photovoltaic film in each cell, by applying a mask (8) according to a printing method, in particular material-jet digital printing, flexography, screen printing, or pad printing, said mask having main areas defining a positive or negative stencil for said holes. The present invention is applicable in the field of solar glazing.

19 Claims, 10 Drawing Sheets

(51) Int. Cl.
*H01L 31/0216* (2014.01)
*H01L 31/05* (2014.01)
*H01L 31/18* (2006.01)

(56) References Cited

U.S. PATENT DOCUMENTS

| | | | |
|---|---|---|---|
| 5,334,259 A | 8/1994 | Mizumura et al. | |
| 2006/0112987 A1 | 6/2006 | Nakata et al. | |
| 2007/0251566 A1 | 11/2007 | Ouchida et al. | |
| 2009/0151783 A1 | 6/2009 | Lu et al. | |
| 2011/0265858 A1 | 11/2011 | Lee et al. | |
| 2012/0125411 A1* | 5/2012 | Ragnow | H01L 31/03928 136/252 |
| 2012/0164780 A1 | 6/2012 | Brunton | |
| 2012/0204933 A1* | 8/2012 | Iwade | H01L 31/022466 136/244 |
| 2012/0270358 A1* | 10/2012 | Haviv | H01L 31/18 438/68 |
| 2012/0291844 A1* | 11/2012 | Tsuge | H01L 31/022425 136/244 |
| 2013/0104966 A1* | 5/2013 | Grip | H02S 10/40 136/251 |
| 2014/0150851 A1* | 6/2014 | Tsuji | H01L 27/1421 136/251 |
| 2014/0352759 A1* | 12/2014 | Barnes | H01L 31/0525 136/246 |

OTHER PUBLICATIONS

International Search Report for International Application No. PCT/FR2013/052523.
English Translation of International Search Report for International Application No. PCT/FR2013/052523.
Written Opinion for International Application No. PCT/FR2013/052523.
English Translation of Written Opinion for International Application No. PCT/FR2013/052523.
English Translation for Abstract of EP1638150A2.
English Translation for Abstract of JP12000223727A.

* cited by examiner

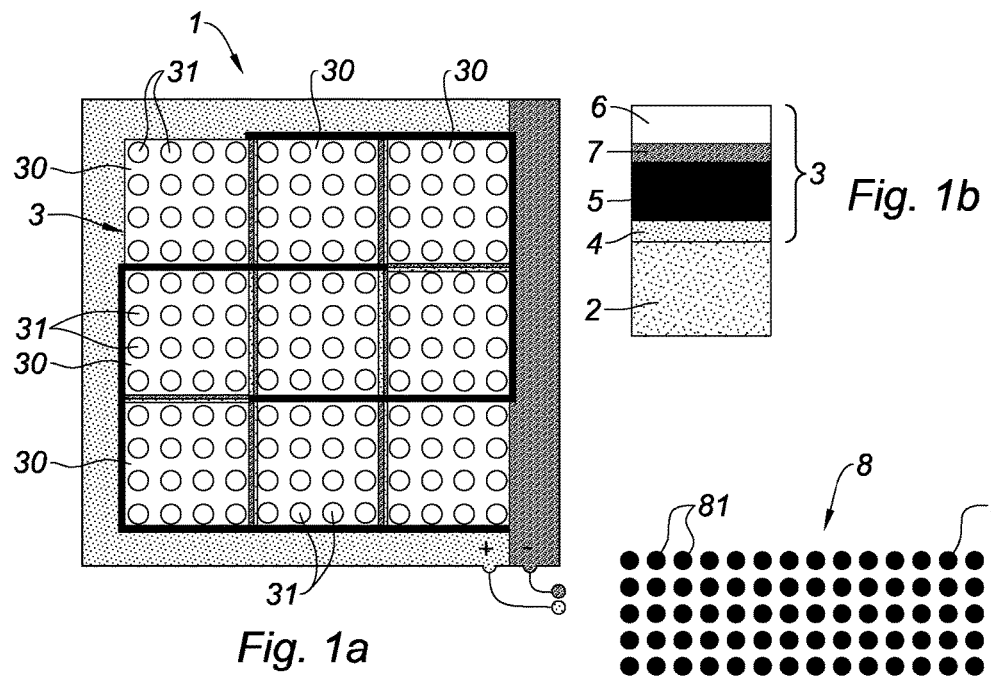
Fig. 1b
Fig. 1a
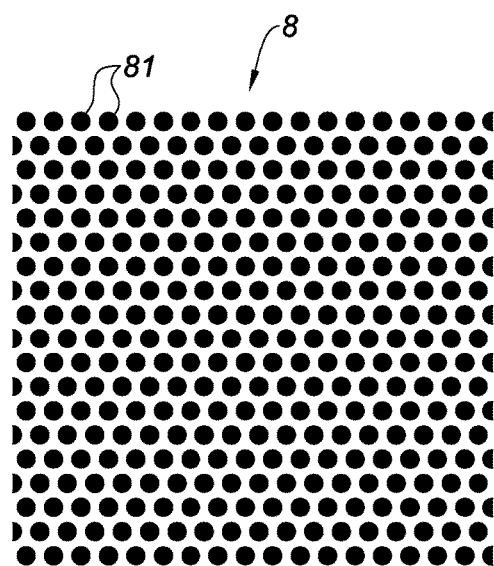
Fig. 2a
Fig. 2b

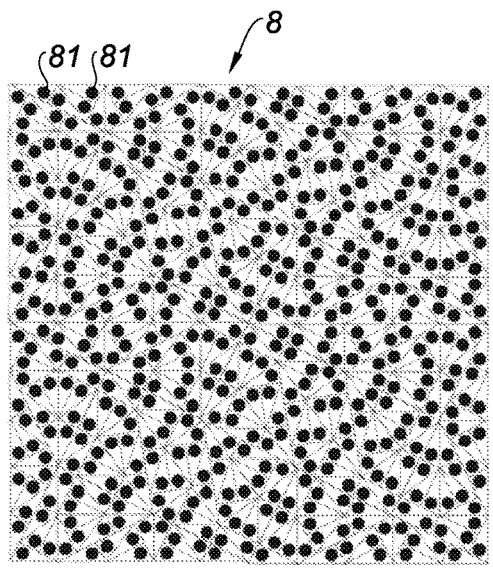 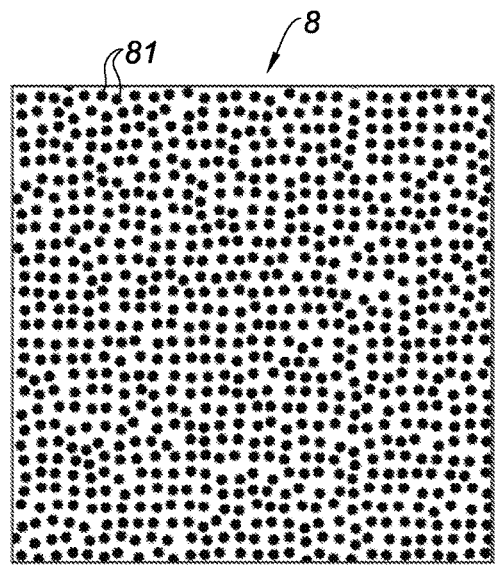
Fig. 3a  Fig. 3b
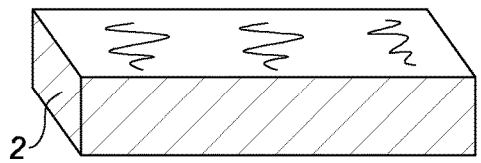 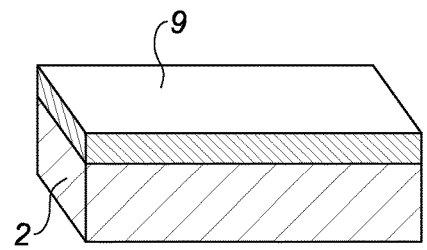
(4a)  (4b)
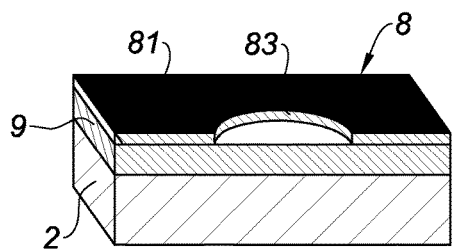 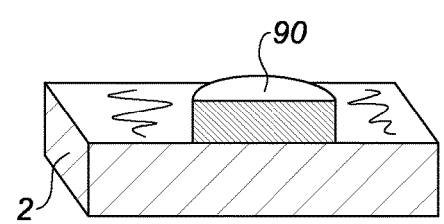
(4c)  (4d)
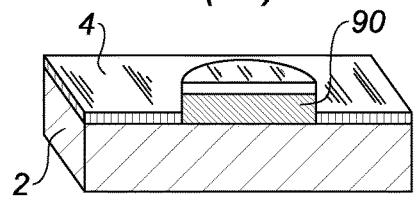 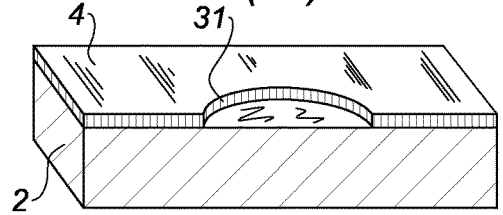
(4e)  (4f)
Fig. 4

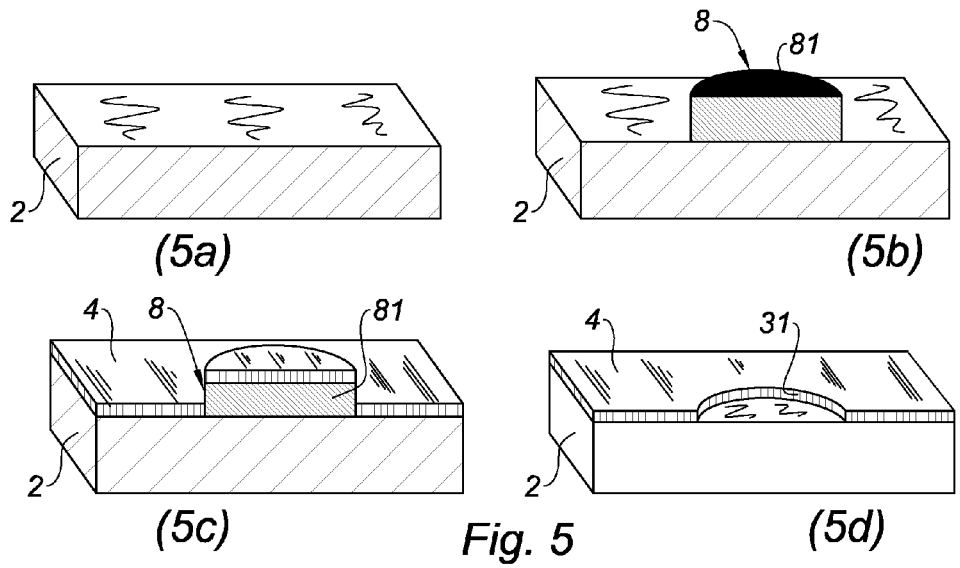
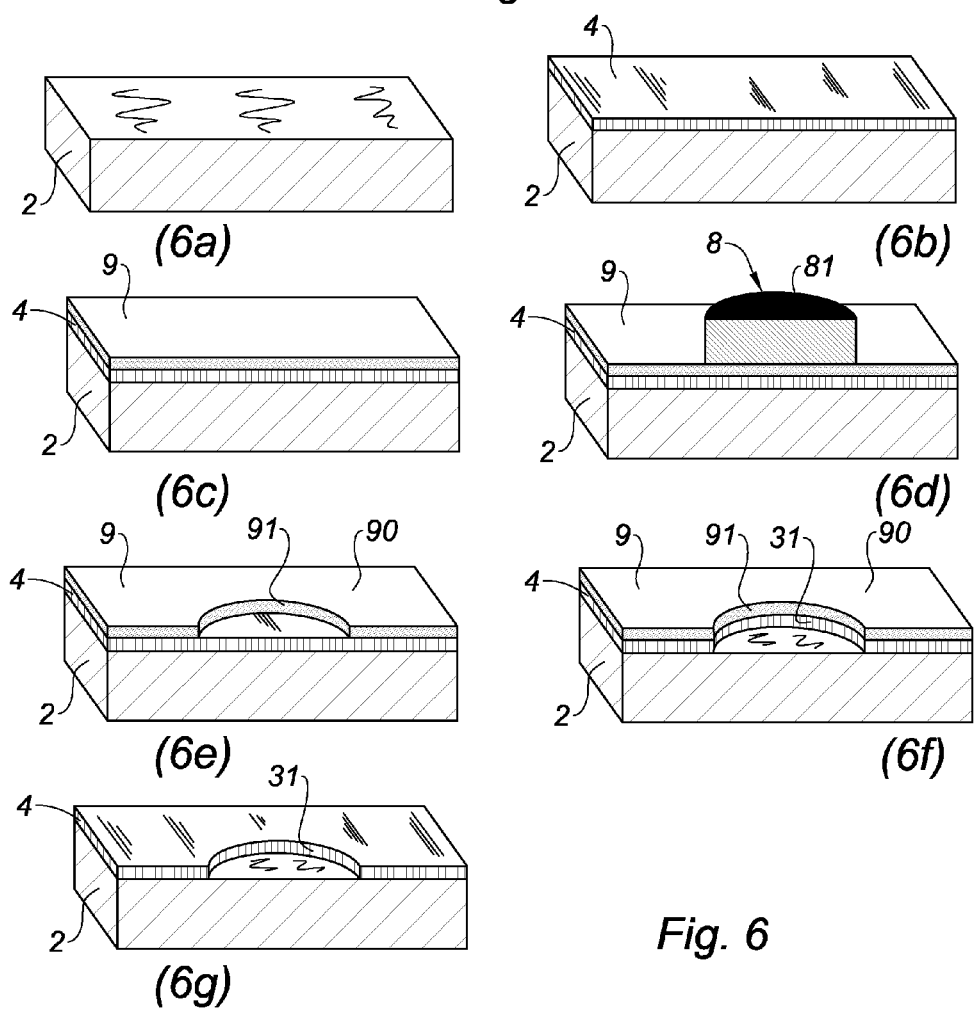
Fig. 5
Fig. 6

(7a)

(7b)

(7c)

(8a)

(8b)

(8c)

(8d)

(8e)

METHOD FOR MANUFACTURING A THIN-LAYER PHOTOVOLTAIC DEVICE, IN PARTICULAR FOR SOLAR GLAZING

TECHNICAL FIELD

The present invention relates to a method for manufacturing a thin-layer photovoltaic device.

More particularly, it relates to a method for manufacturing a photovoltaic device comprising the following steps:
- a substrate is provided;
- a photovoltaic film is placed over the substrate by the superposition of layers comprising at least a first conductive layer forming a rear electrical contact, a second photoactive layer absorbing in the solar spectrum based on inorganic material, and a third layer made of transparent conductive material forming a front electrical contact;
- the photovoltaic film is divided into a plurality of individual and interconnected photovoltaic cells, each cell being connected in series or in parallel with one or several adjacent cell(s) and electrically insulated from the other adjacent cells.

BACKGROUND

The photovoltaic device obtained with such a method finds a particular application in the field of glazing called solar glazing or glazing called photovoltaic glazing, in which the substrate is constituted of a transparent glass substrate—or transparent glazing—with interconnected and more or less spaced photovoltaic cells so as to choose the best ratio between the light or the overall transparency and the energy performance. The glazing can be of the double or triple glazing type, in the form of a laminated, insulating glazing, etc.

However, the present invention is not limited to such an application and other substrates can be considered with such a method, as for example by using a substrate made of organic material, a substrate made of plastic material or polymers-based substrate, a substrate made of treated glass, for example of frosted, tinted, opaque glass, etc., a metal substrate, a substrate made of construction material, for example of concrete, of composite material, etc., optionally covered with a paint layer and/or a protective layer.

BRIEF SUMMARY

The object of the present invention is to apply, over the substrate, a series of thin layers forming a photovoltaic film defining several interconnected photovoltaic cells which are shaped to let pass part of the light in order to confer to the photovoltaic film some transparency which ensures the visibility of a portion of the substrate. Thus the photovoltaic film offers opaque areas and transparent areas which respectively allow hiding and exposing the substrate from the outside. For the following description, an area of the photovoltaic film is considered as transparent insofar as it easily lets light pass therethrough and clearly allows to distinguish the substrate through its thickness.

The Integration of photovoltaic devices in a building is facing several constraints: the photovoltaic surface that may be used on a roof and/or a facade, the cost, the dimensions of the photovoltaic devices which should preferably be standardized in order to comply with the standards and usages in the field of construction, the installation of the photovoltaic devices with constraints of insulation, sealing, mechanical strength, wind resistance, etc. and the aesthetics of the photovoltaic devices particularly in an integration on a facade.

To address these constraints, it is known to use photovoltaic devices called thin-layer or "thin film" photovoltaic devices, using a photoactive layer absorbing in the solar spectrum, with a thickness ranging from a few atoms of thickness to about ten micrometers, made based on semi-conductive inorganic material, in particular based on $Cu_2S/CdS$, of a-Si:H (hydrogenated amorphous silicon), CdTe (cadmium telluride), and $CuInSe_2$ (Copper Indium Selenium or CIS), $CuInGaSe_2$ (Copper Indium Galium Selenium or CIGS).

These thin-layer photovoltaic devices based on inorganic materials belong to the second generation, after the first generation based on crystalline silicon, and before the third generation based on organic materials.

The organic photovoltaic materials are naturally transparent, however, they have limited lifespans, generally in the order of a few thousands hours, and low electrical efficiencies or performances (efficiency in the order of 5 to 9% against 15 to 20% for the inorganic photovoltaic materials of the second generation), which are incompatible with an integration in a building.

The inorganic photovoltaic materials do not have intrinsic properties of transparency, and only the layout of the photovoltaic cells over the substrate will confer to the photovoltaic film a required transparency in order to be able to partly see the substrate through the film. Indeed, these inorganic photovoltaic materials have a very high light absorption level, for example, with an absorption of 99% of the light reaching the surface of the CIGS material on the first micrometer thickness. Thus, for the CIGS, a thickness of material that is larger than one micron leads to a layer that is opaque to the light.

The present invention thus focuses on the realization of the layout of the photovoltaic cells made based on thin layers of inorganic photovoltaic material.

Generally, in a thin-layer photovoltaic device, the photovoltaic film is composed of a superposition of layers comprising a first conductive layer forming a rear electrical contact, a second photoactive layer absorbing in the solar spectrum and based on inorganic material, a third layer made of transparent conductive material forming a front electrical contact.

The third front contact layer may for example be constituted of a double-film layer of zinc oxide (ZnO) doped with elements of the group III such as aluminum, and it presents the highest possible luminous transmission in the range of wavelength related to the second photoactive layer. It is known to use an intermediate thin layer, called window or "buffer" layer, between the second and the third layer, generally based on CdS (cadmium sulfide), ZnS, ZnSe, $SnIn_2Se_4$, $Zn_{1-x}Mg_xO$, $In_2S_3$, etc.

The second layer, called absorber, is made based on semi-conductive inorganic materials of type the I-III-VI, such as for example the CIGS, often referenced as chalcogenides materials.

The first layer is deposited over the substrate and has both ohmic properties to ensure an optimal recovery of the charges emitted by the second photoactive layer as well as optical properties to ensure reflection toward the second layer of the portion of the luminous spectrum that is not absorbed in direct transmission.

In the field of solar glazing based on thin layers of inorganic photovoltaic material, it is known to make the solar glazing by depositing, in a uniform manner, a photovoltaic film on the glass substrate, through superposition of the aforementioned thin layers, then by removing, through mechanical engraving or laser, strips in the photovoltaic film, which allows to obtain opaque and parallel photovoltaic strips, presenting a width in the order of centimeter and regularly spaced from one other with a spacing equivalent to the width of the strips; the cells being interconnected at their ends, the interconnections being generally hidden by the frame of the glazing.

Thus, the overall transparency of the glazing is in the order of 50%, but these photovoltaic strips, distributed in a linear array with a resolution in the order of centimeter, offer a real visual discomfort for the building users who look through the glazing.

The present invention aims to propose a method for manufacturing a thin-layer photovoltaic device made with a photovoltaic film based on semi-conductive inorganic material, of the second generation, which allows to control the geometry of the photovoltaic cells with a resolution lower than the millimeter, and preferably in the order of micrometer or even less or of ten micrometers, in order to obtain a film with a controlled transparency between 10 and 90% and a visual comfort resulting from a high resolution which provides the perception of a quasi-uniformity of the layout of the opaque layers.

To this end, it proposes a method for manufacturing a thin-layer photovoltaic device, comprising the following steps:
  a substrate is provided;
  a photovoltaic film is placed on said substrate by the superposition of layers comprising at least a first conductive layer forming a rear electrical contact, a second photoactive layer absorbing in the solar spectrum based on inorganic material, and a third layer of transparent conductive material forming a front electrical contact;
  the photovoltaic film is divided into a plurality of individual and interconnected photovoltaic cells, each cell being connected in series or in parallel with one or several adjacent cell(s) and electrically insulated from the other adjacent cells, wherein the method is remarkable in that, upon placing the photovoltaic film, a plurality of individual perforations passing through at least the first and the second layers of the photovoltaic film in each cell is arranged, by the application of a mask according to a printing method, in particular of the type material-jet digital printing, flexography, screen-printing or pad-printing, said mask presenting main areas defining a positive or a negative stencil of said perforations.

The use of such a mask deposited by printing is really advantageous to obtain the desired resolutions in the distribution of perforations. Thanks to this printing technique (over the substrate, over a resin layer or over the first layer, as explained later), it is possible to guarantee micrometric dimensions of the perforations and micrometric spacings between the perforations.

In accordance with the invention, the mask serves therefore to make perforations at least in the first layer and in the second layer, to obtain a controlled transparency of the photovoltaic film.

According to one possibility of the invention, the sequence called main sequence is carried out, including the following steps:
  the perforations are arranged in the first layer by means of the mask;
  the second layer is deposited over the non-perforated portions of the first conductive layer, preferably by electrodeposition;
  the third layer is deposited, preferably by evaporation.

The third transparent layer does not modify the transparency and thus may cover the bare areas of the substrate in the orifices passing through the first layer.

It may be considered to provide for several modes of use of the mask.

According to a first use of the mask, the following first sequence is carried out:
  a first uniform conductive layer is deposited over the substrate;
  a photosensitive resin layer is deposited over the first uniform conductive layer;
  the mask is deposited over the resin layer, said mask forming a positive stencil of the geometric conformation of the perforations;
  the resin is insolated by applying a luminous radiation;
  the areas of the resin layer that have not been exposed to the luminous radiation and corresponding to the areas of the resin layer that have been masked by the mask, are eliminated, laying bare areas of the first uniform conductive layer and leaving in place islets of insolated resin;
  the areas of the first conductive layer that have been laid bare, between the islets of insolated resin, are eliminated, thereby forming through orifices in said first conductive layer;
  the islets of insolated resin remaining on the first conductive layer are eliminated, thereby leaving over the substrate only but the first conductive layer presenting positive orifices of the mask.

Afterwards, the steps of the above-mentioned main sequence are resumed.

According to a second use of the mask, the following second sequence is carried out:
  a photosensitive layer is deposited over the substrate;
  the mask is deposited over the resin layer, said mask forming a negative stencil of the geometric conformation of the perforations;
  the resin is insolated by applying a luminous radiation;
  the areas of the resin layer that have not been exposed to the luminous radiation and corresponding to the areas of the resin layer that have been masked by the mask, are eliminated, laying bare areas of the substrate and leaving in place islets of insolated resin;
  a first conductive layer, which covers the remaining islets of insolated resin and the areas of the substrate that have been laid bare, is deposited in a uniform manner.

Following this second sequence, two options may be considered.

In a first option, following the deposition of the first conductive layer, the remaining islets of insolated resin are eliminated, leaving over the substrate only but the first conductive layer presenting negative orifices of the mask. Afterwards, the steps of the above-mentioned main sequence are resumed.

In a second option, following the deposition of the first conductive layer:
  the second layer, which covers the first conductive layer, is deposited in a uniform manner;
  the third layer, which covers the second layer, is deposited in a uniform manner;
  the remaining islets of insolated resin are eliminated, leaving over the substrate the photovoltaic film presenting negative perforations of the mask.

In this second option, the second and third layers are uniformly deposited, preferably by vaporization, and not in a selective manner as in the case of the first option.

According to a third use of the mask, the following sequence is carried out:
the mask is deposited over the substrate, said mask forming a positive stencil of the geometric conformation of the perforations;
a first conductive layer, which covers the mask and the bare areas of the substrate, is deposited in a uniform manner.

Thus, the mask is deposited directly over the substrate, and no longer on a resin layer as in the first and second uses. Following this sequence, two options may be considered.

In a first option, following the deposition of the first conductive layer, the mask is eliminated, leaving over the substrate only but the first conductive layer presenting positive orifices of the mask. Afterwards, the steps of the above-mentioned main sequence are resumed, in this case:
the second layer is deposited on the non-perforated portions of the first conductive layer, preferably by electrodeposition;
the third layer is deposited, preferably by evaporation.

In a second option, following the deposition of the first conductive layer:
the second layer, which covers the first conductive layer, is deposited in a uniform manner;
the third layer, which covers the second layer, is deposited in a uniform manner;
the mask is eliminated, leaving over the substrate the photovoltaic film presenting positive perforations of the mask.

Advantageously, the mask presents secondary areas defining a positive or a negative of separating strips between the cells.

Thus, the mask is advantageously utilized to directly prepare the separating between the photovoltaic cells.

Advantageously, the perforations are arranged in compliance with the following geometric characteristics:
each perforation presents dimensions in the main plane comprised between 10 nanometers and 400 micrometers,
each perforation is distant from the nearest adjacent perforation by a distance comprised between 5 nanometers and 400 micrometers,
each cell presents a perforated surface, corresponding to the surface of the perforations disposed in said cell in the main plane, which is comprised between 10 and 90% of the total surface of the cell (30) in this same main plane, preferably between 30 and 70%.

Thus, the photovoltaic cells are perforated, at least over the thickness of the first and second layers (the third layer being transparent), and these perforations are distributed, in a quasi-uniform manner, in each cell with a resolution comprised between 5 nanometers and 400 micrometers, guaranteeing, for the human eye, a quasi-uniform perception of the outer surface of the film, with a controlled transparency of the film which insures visibility of the support through the film.

Indeed, the resolving power of the eye (minimum distance which should exist between two contiguous points so that they are correctly discerned) is of about one minute of arc, namely 0.017°, which corresponds to a minimum distance of about 600 micrometers for an image located at a distance of 2 meters from the eye.

According to a first possibility, the perforations are distributed over the surface of each cell according to a non-periodic distribution, in particular according to a non-periodic paving. For example, the perforations are distributed over the surface of each cell according to a random distribution, in particular according to a random paving.

According to a second possibility, the perforations are distributed over the surface of each cell according to a periodic distribution, in particular according to a periodic paving.

According to one characteristic, the perforations are distributed over the surface of each cell according to a virtual paving composed of a plurality of elementary photovoltaic units, juxtaposed without void and without encroachment so as to define the corresponding cell, each elementary unit being in the form of a geometric portion of the photovoltaic film delimited by a virtual outline and to which there is associated at least one perforation arranged in whole or in part inside said outline, each perforation being associated to one single elementary unit, and wherein each elementary unit presents a perforated surface, corresponding to the surface of the perforation(s) associated to said elementary unit in the main plane, which is comprised between 10 and 90% of the total surface of the elementary unit in this same main plane, preferably between 30 and 70%.

Thus, each photovoltaic cell is geometrically defined by a paving of elementary photovoltaic units and each of these present units is perforated so as to intrinsically offer the desired overall transparency. In this manner, the macroscopic photovoltaic cell presents the same transparency as its own elementary units which compose it.

According to another characteristic, each elementary unit presents dimensions in the main plane comprised between 10 and 800 micrometers.

In a particular embodiment, the substrate is constituted of a glass substrate, so as to make a photovoltaic or solar glazing.

Preferably, the first layer is an opaque metallic layer. This first layer is positioned on the substrate side, in particular directly in contact over the substrate.

BRIEF DESCRIPTION OF THE DRAWINGS

Other characteristics and advantages of the present invention will appear upon reading the detailed description below, of several non-limiting implementation examples, with reference to the appended figures wherein:

FIG. 1a is a schematic front view of a photovoltaic device in accordance with the invention;

FIG. 1b is a schematic sectional view of the photovoltaic film of the device of FIG. 1a;

FIG. 2a is a schematic front view of a mask established according to a first orthogonal or square periodic paving;

FIG. 2b is a schematic front view of a mask established according to a second staggered or honeycomb periodic paving;

FIG. 3a is a schematic front view of a mask established according to a first non-periodic paving of the "pinwheel"-type, FIG. 3b is a schematic front view of a mask established according to a second non-periodic paving of the random-type;

FIG. 4 represents schematic partial-sectional views of a first sequence for making, over a substrate, a first conductive layer with through orifices (six steps 4a to 4f being illustrated);

FIG. 5 represents schematic partial-sectional views of a second sequence for making, over a substrate, a first conductive layer with through orifices (four steps 5a to 5d being illustrated);

FIG. 6 represents schematic partial-sectional views of a third sequence for making, over a substrate, a first conductive layer with through orifices (seven steps 6a to 6g being illustrated);

FIG. 10 represents schematic partial-sectional views of an additional sequence for depositing the second and third layers, following the first, second or third sequence illustrated in FIGS. 4 to 6 (five steps 10a to 10e being illustrated), wherein FIG. 10 illustrates more specifically the implementation of interconnection steps between two adjacent cells;

FIG. 11 represents schematic partial-sectional views of a sequence for depositing, over a substrate, the first, second and third layers with through perforations (six steps 11a to 11f being illustrated), wherein FIG. 11 illustrates more specifically the implementation of interconnection steps between two adjacent cells;

DETAILED DESCRIPTION

Figure 7:
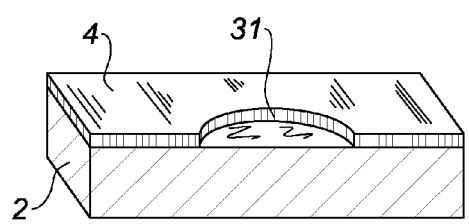
FIG. 7 represents schematic partial-sectional views of an additional sequence for depositing the second and third layers, following the first, second or third sequence illustrated in FIGS. 4 to 6 (three steps 7a to 7c being illustrated)
Figure 7:
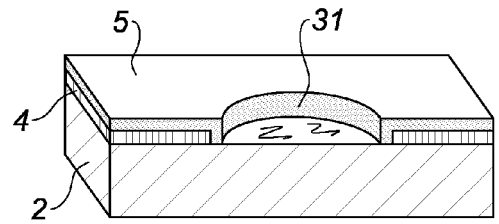
Figure 7:
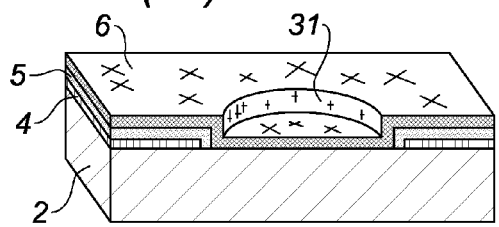

With reference to FIGS. 1a and 1b, a thin-layer photovoltaic device 1 in accordance with the invention comprises:
  a substrate 2, such as a glass substrate for an application in the solar glazing; and
  a photovoltaic film 3 composed of a superposition of layers distributed along a plane called main plane, and divided into a plurality of individual and interconnected photovoltaic cells 30, each cell 30 being connected in series or in parallel with one or several adjacent cell(s) 30 and insulated from the other adjacent cells.

Referring to FIG. 1b, the photovoltaic film 3 is composed of a superposition of the following successive thin layers:
  a first conductive layer 4, in particular a metallic-type layer, forming a rear electrical contact deposited over the substrate;
  a second photoactive layer 5 absorbing in the solar spectrum based on inorganic material, in particular based on CIGS;
  a third layer 6 made of transparent conductive material forming a front electrical contact, in particular of conductive oxide; and
  optionally an intermediate thin layer 7, called window or "buffer" layer and in particular based on CdS, between the second and the third layers 5, 6.

Each cell 30 comprises a plurality of individual perforations 31 passing through either the first and second layers 4, 5, or the first, second and third layers 4, 5, 6; these perforations 30 thereby ensuring semi-transparency of the cells 30, the perforated areas being transparent to the visible light and the non-perforated areas being opaque to the visible light.

These perforations 31 are advantageously distributed over each cell 30 according to the following geometric conformation:
  each perforation 31 presents dimensions in the main plane comprised between 10 nanometers and 400 micrometers (these dimensions corresponding to their diameters in the case of circular perforations);
  each perforation 31 is distant from the nearest adjacent perforation 31 at a distance comprised between 5 nanometers and 400 micrometers;
  the total surface of the perforations 31 disposed in the cell 30 taken in the main plane, is comprised between 10 and 90% of the total surface of the cell 30 in this same main plane.

Thus, each cell 30 presents a transparency comprised between 10 and 90%, depending on the total surface occupied by the perforations 31 in the concerned cell 30. The dimensions of the perforations 31 and the distances between perforations are selected so as to offer a visual comfort in accordance with the resolving power of the eye, so that the human eye distinguishes little the perforations 31 in the cells 30 and sees a substantially uniform surface.

The following description is about the method for manufacturing such a photovoltaic device 1, starting from the substrate 2 over which it is desired to deposit the photovoltaic film 3 divided into perforated and interconnected cells 30; several variants may be considered.

FIGS. 4 to 6 illustrate three distinct sequences allowing to make a first perforated layer 4 according to the aforementioned geometric conformation, by using a mask 8 according to a printing method, in particular of the type material-jet digital printing, flexography, screen-printing or pad-printing, said mask 8 presenting areas called main areas 81 defining a positive or a negative of the perforations 31.

This mask 8 will serve as a stencil which will allow to make the distribution of the perforations 31 on the first layer 4 according to the aforementioned geometric conformation, the main areas 81 of the mask 8 defining:
  either a positive of the perforations 31, in other words the areas that have been obscured by the main areas 81 corresponding in fine to the perforations 31;
  or a negative of the perforations 31, in other words the areas that have not been obscured by the main areas 81 corresponding in fine to the perforations 31.

Working by printing, the mask 8 can take the shape of a masking material layer, such as ink, forming the negative or the positive of the perforations 31.

In the case of a mask 8 forming a positive of the perforations 31, the mask 8 includes, for each cell, a plurality of individual main areas 81 of masking material, distributed over each cell according to the following geometric conformation:
  each main area 81 presents dimensions in the main plane comprised between 10 nanometers and 400 micrometers (these dimensions corresponding to their diameters in the case of circular areas 81);
  each main area 81 is distant from the nearest adjacent main area 81 at a distance comprised between 5 nanometers and 400 micrometers;

the total surface of the main areas 81 disposed in the cell taken in the main plane, is comprised between 10 and 90% of the total surface of the cell 30 in this same main plane.

Thus, with a mask 8 forming a positive of the perforations 31, the mask 8, for each cell, is in the form of a plurality of main areas 81 spaced apart from each other (as illustrated in particular in FIG. 12*a* and FIGS. 2*a*, 2*b*, 3*a* and 3*b*).

In the case of a mask 8 forming a negative of the perforations 31, the mask 8 includes, for each cell, contiguous main areas 81 framing individual perforations 83 distributed over each cell according to the following geometric conformation:

each perforation 83 of the mask 8 presents dimensions in the main plane comprised between 10 nanometers and 400 micrometers (these dimensions corresponding to their diameters in the case of circular perforations);

each perforation 83 of the mask 8 is distant from the nearest adjacent perforation 83 at a distance comprised between 5 nanometers and 400 micrometers;

the total surface of the perforations 83 of the mask 8 disposed in the cell taken in the main plane, is comprised between 10 and 90% of the total surface of the cell in this same main plane.

Thus, with a mask 8 forming a negative of the perforations 31, the mask 8, for each cell, is in the form of a continuous layer of masking material, in which there are provided perforations 83 spaced from each other (as visible in FIG. 4*c*).

In the first sequence illustrated in FIG. 4, a substrate 2 is provided (FIG. 4*a*), then:

a photosensitive resin layer 9 is deposited over the substrate 2 (FIG. 4*b*);

the mask 8, made in a layer of opaque masking material, is deposited over the resin layer 9, this opaque mask 8 forming a negative stencil of the geometric conformation of the perforations 31 by presenting perforations 83 as described above (FIG. 4*c*);

the resin 9 is insolated by applying a luminous radiation, then the areas of the resin layer 9 that have not been exposed to the luminous radiation and corresponding to the areas of the resin layer 9 that have been masked by the mask 8, are chemically eliminated (by stripping), laying bare areas of the substrate and leaving in place islets of the insolated resin 90 (FIG. 4*d*);

a first layer 4, which covers the remaining islets of insolated resin 90 and the areas of the substrate 2 that have been laid bare, is deposited in a uniform manner, by spraying or by evaporation, (FIG. 4*e*);

the remaining islets of insolated resin 90 are eliminated, leaving over the substrate 2 only but the first layer 4 presenting negative orifices 31 of the mask 8.

In the second sequence illustrated in FIG. 5, a substrate 2 is provided (FIG. 5*a*), then:

the mask 8 is deposited over the substrate 2, this mask 8 forming a positive stencil of the geometric conformation of the perforations 31 by presenting individual main areas 81 as described above (FIG. 5*b*);

a first layer 4, which covers the mask 8 and the bare (not masked) areas of the substrate 2, is deposited in a uniform manner, by spraying or by evaporation, (FIG. 5*c*);

the mask 8 is chemically eliminated, leaving over the substrate 2 only but the first layer 4 presenting positive orifices 31 of the mask 8 (FIG. 5*d*).

In this second sequence, the optical characteristics of the mask 8 do not matter, in other words the mask 8 may or may not be opaque. Indeed, the mask 8 is used to form a physical barrier for the deposition of the first layer 4, without making use of an insolation step.

In the third sequence illustrated in FIG. 6, a substrate 2 is provided (FIG. 6*a*), then:

a first layer 4 is deposited over the substrate 2 in a uniform manner, by spraying or by evaporation (FIG. 6*b*);

a photosensitive resin layer 9 is deposited over the first uniform layer 4 (FIG. 6*c*);

the mask 8, made in a layer of opaque masking material, is deposited over the resin layer 9, this opaque mask 8 forming a positive stencil of the geometric conformation of the perforations 31, by presenting individual main areas 81 as described above (FIG. 6*d*);

the resin 9 is insolated by applying a luminous radiation through the previously deposited mask 8, and then the areas of the resin layer 9 that have not been exposed to the luminous radiation and corresponding to the areas of the resin layer 9 that have been masked by the main areas 81 of the mask, are chemically eliminated (by stripping), laying bare areas of the first uniform layer 4 and leaving in place islets of insolated resin 90 surrounding perforations 91 in the resin layer 9 (FIG. 6*e*);

the areas of the first layer 4 that have been laid bare, between the islets of insolated resin 90 and through the perforations 91, are eliminated by chemical engraving, thereby forming through orifices namely the perforations 31—in the first layer 4 (FIG. 6*f*);

the remaining islets of insolated resin 90 on the first layer 4 are eliminated, leaving over the substrate 2 only but the first layer 4 presenting the positive perforations 31 of the mask 8 (FIG. 6*g*).

Starting from the end of any one of the three sequences described above with reference to FIGS. 4 to 6, there is hence obtained, over the substrate 2, a first layer 4 with perforations 31 disposed in accordance with the desired geometric conformation.

To deposit the second and third layers 5, 6 over such a first perforated layer 4, it may be considered to proceed as follows, with reference to FIG. 7:

there is disposed the substrate 2 over which the first layer 4 with the perforations 31 (FIG. 7*a*) is deposited;

the second layer 5 is deposited by electrodeposition over the non-perforated portions of the first layer 4 (FIG. 7*b*), the first conductive layer 4 serving as an electrode which will attract the photoactive semi-conductive material of the second layer 5 once the first layer 4 is polarized and immersed in an electrodeposition bath, the non-polarized areas of the substrate 2 that have been laid bare being spared by the electrodeposition;

the third layer 6 is deposited by evaporation (FIG. 7*c*).

The deposition of the third layer 6 is carried out by evaporation, thereby covering the entire surface, including the perforations 31, which causes no prejudice because the third layer 6 is naturally transparent, furthermore, the step of electrodeposition guarantees that the second layer 5 entirely wraps the first layer 4, which prevents the third layer 6 from coming into contact with the first layer 4 and short-circuiting the cell.

In the case of the aforementioned three sequences using a mask 8, the mask 8 has been used only to make the perforations 31 in the first layer 4, before getting rid of it for proceeding to the deposition of the second layer 5 by electrodeposition.

However, it may be considered to provide variants wherein the mask 8 is preserved and removed only at the end of the process, after depositing the second and third layers 5.

Figure 8:
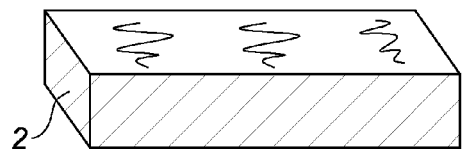
FIG. 8 represents schematic partial-sectional views of a sequence for depositing, over a substrate, the first, second and third layers with through perforations (five steps 8a to 8e being illustrated)
Figure 8:
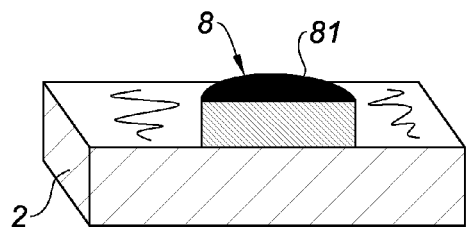
Figure 8:
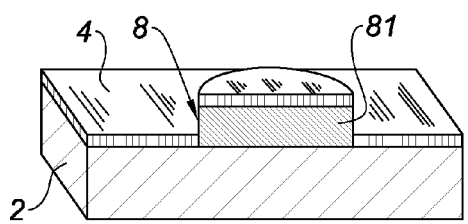
Figure 8:
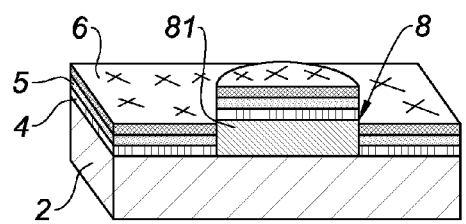
Figure 8:
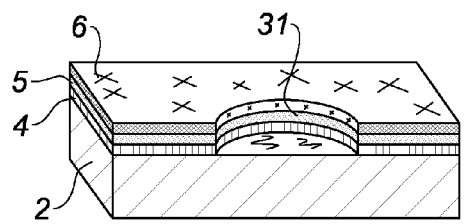

In a first variant illustrated in FIG. 8, which constitutes a variant of the second sequence of FIG. 5, a substrate 2 (FIG. 8*a*) is provided, then:
- the mask 8 is deposited over the substrate 2, this mask 8 forming a positive stencil of the geometric conformation of the perforations 31 by presenting main areas 81 as described above (FIG. 8*b*);
- a first layer 4, which covers the mask 8 and the bare (not masked) areas of the substrate 2 is deposited in a uniform manner by spraying or by evaporation (FIG. 8*c*);
- a second layer 5 is deposited in a uniform manner, by spraying or by evaporation, a third layer 6 is deposited in a uniform manner, by spraying or by evaporation (FIG. 8*d*); and
- the mask 8 is chemically eliminated, leaving over the substrate 2 only but the first, second and third layers 4, 5, 6 presenting the positive perforations 31 of the mask 8 (FIG. 8*e*).

Figure 9:
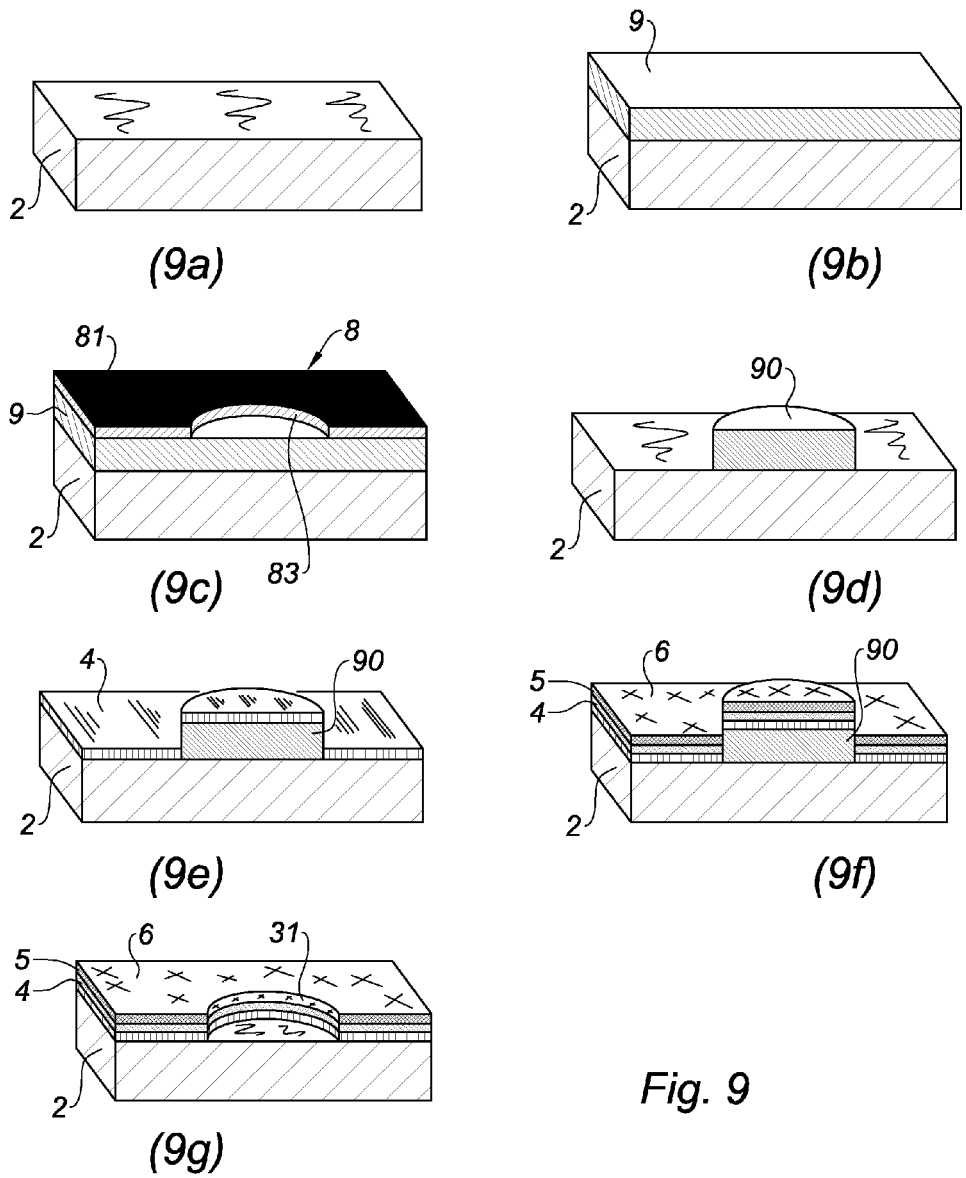
FIG. 9 represents schematic partial-sectional views of another sequence for depositing, over a substrate, the first, second and third layers with through perforations (seven steps 9a to 9g being illustrated)

In a second variant illustrated in FIG. 9, which constitutes a variant of the first sequence of FIG. 4, a substrate 2 (FIG. 9*a*) is provided, then:
- a photosensitive resin layer 9 is deposited over the substrate 2 (FIG. 9*b*);
- the mask 8, made in a layer of opaque masking material, is deposited over the resin layer 9, this mask forming a negative stencil of the geometric conformation of the perforations (FIG. 9*c*);
- the resin 9 is insolated by applying a luminous radiation, then the areas of the resin layer 9 that have not been exposed to the luminous radiation and corresponding to the areas of the resin layer 9 that have been masked by the opaque mask 8, are chemically eliminated (by stripping), laying bare areas of the substrate and leaving in place islets of insolated resin 90 (FIG. 9*d*);
- a first layer 4, which covers the remaining islets of insolated resin 90 and the areas of the substrate 2 that have been laid bare, is deposited in a uniform manner, by spraying or by evaporation (FIG. 9*e*);
- a second layer 5 is deposited in a uniform manner, by spraying or by evaporation, then a third layer 6 is deposited in a uniform manner, by spraying or by evaporation (FIG. 9*f*); and
- the remaining islets of insolated resin 90 are eliminated, leaving over the substrate 2 only but the first, second and third layers 4, 5, 6 presenting the negative perforations 31 of the mask 8 (FIG. 9*g*).

In these two variants, the third layer 6 does not cover the perforations 31, because the mask 8 is removed after placing this third layer 6, thereby avoiding short circuit between the first and third layers 4, 6.

Figure 10:
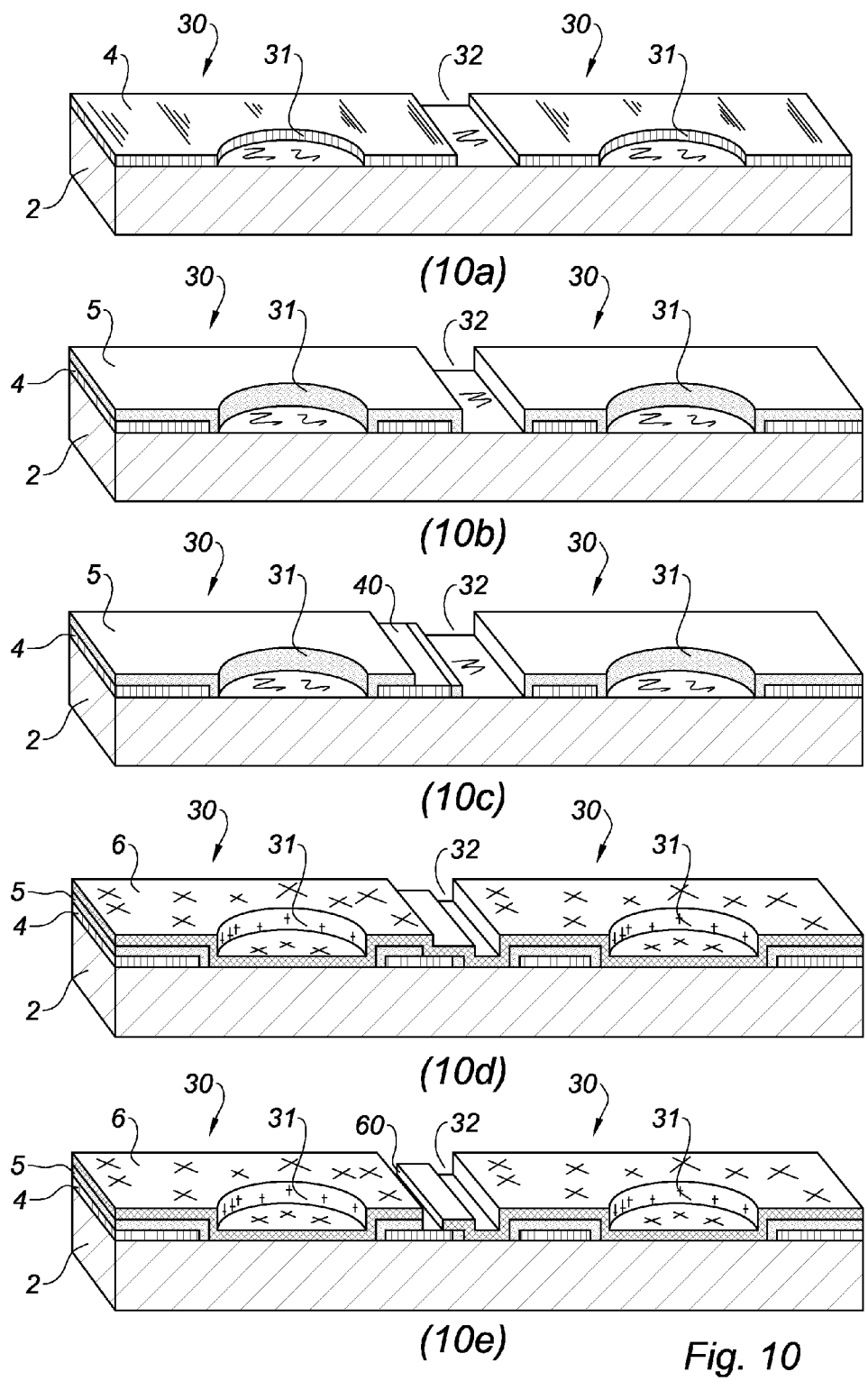
Figure 11:
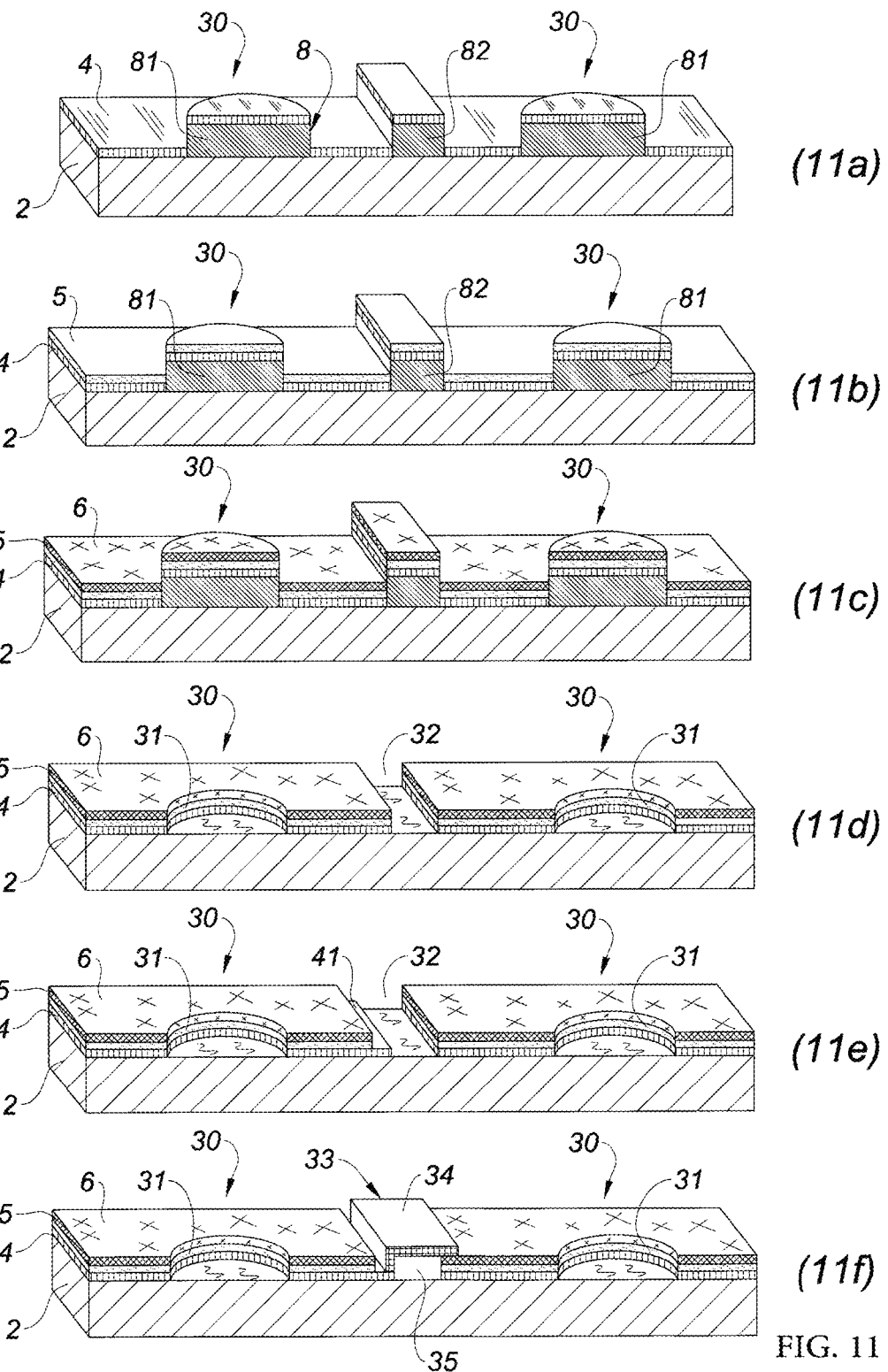

The following description is about the division of the photovoltaic film into several cells, and about the interconnection between two adjacent cells, with reference to FIGS. 10 to 12.

FIGS. 10 and 12 illustrate an improvement of the steps of FIG. 7, by focusing on the sub-steps intended to ensure the interconnection between two adjacent cells 30, in other words the electrical connection between the first layer 4 of a cell 30 and the third layer 6 of an adjacent cell 30.

Figure 12A:
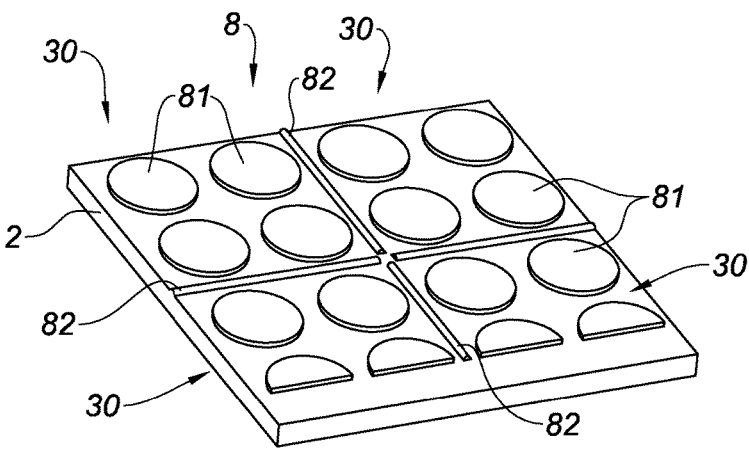
FIGS. 12a to 12k represent schematic perspective views of a sequence for depositing, over a substrate, the first, second and third layers with through perforations (eight steps being illustrated, FIG. 12g being a zooming of a portion of FIG. 12f and FIG. 12k being a zooming of a portion of FIG. 12j), wherein the sequence is identical to that of FIG. 10, FIGS. 12a to 12k illustrating four cells adjacent in pairs.
Figure 12B:
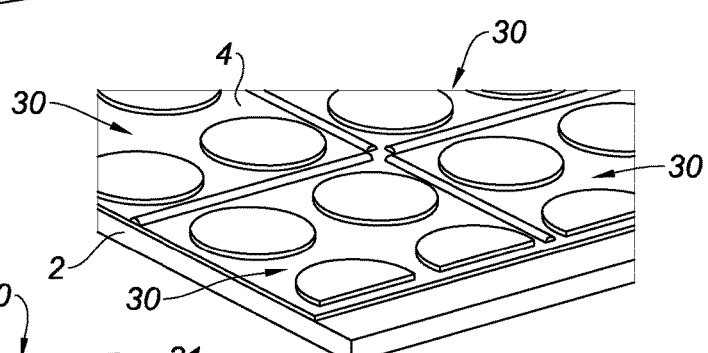
Figure 12C:
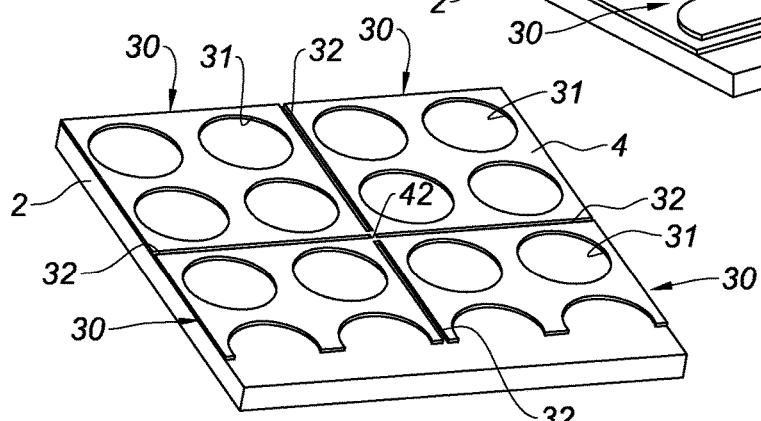

FIGS. 10*a* and 12*c* illustrate each a substrate 2 over which a first layer 4 is deposited, with two cells 30 (FIG. 10*a*) or four cells 30 (FIG. 12*c*) separated by respective separating strips 32. Each separating strip 32 electrically separates the first layer 4 of a cell 30 from the first layer 4 of an adjacent cell 30.

Several embodiments of the separating strips 32 can be considered, being specified that a separating strip 32 constitutes a perforated groove or notch in the first layer 4. Thus, the separating strip 32 is made in the same manner as the perforations 31.

In a first embodiment, the separating strip 32 is made by direct engraving, in the same manner as in the first sequence illustrated in FIG. 3.

In a second embodiment, the separating strip 32 is made from a mask which presents secondary areas 82 defining a positive or a negative of the separating strips 32 between the cells, that is to say:
- either a positive as in the second and third sequences of FIGS. 5 and 6, the secondary area 82 then being in the form of strips 82 which delimit the cells 30;
- or a negative as in the first sequence of FIG. 4, the secondary areas 82 framing slots which delimit the cells 30 and which pass through the layer of the mask 8.

FIG. 12*a* illustrates the application of a positive mask 8 directly over the substrate (as in the second sequence illustrated in FIG. 5) with the main 81 and secondary 82 areas. Note that the secondary areas 82 are not joined at the intersection between the four cells 30.

FIG. 12*b* then illustrates the uniform application of the first layer 4 over the substrate 2 and the mask 8.

FIG. 12*c* illustrates the step of chemically eliminating the mask 8, leaving over the substrate 2 only but the first layer 4 presenting the perforations 31 and the separating strips 32. Note that the first layers 4 of all the cells 30 are electrically connected because the secondary areas 82 are not joined, leaving thus an electrical contact 42 between these cells 30 after removal of the mask 8. This electrical contact 42 between the cells 30 aims to facilitate the step of electrodepositing the second layer 5, because it is sufficient to polarize all cells 30 in an equivalent manner.

Starting from the first layer 4 with the perforations 31 and the separating strips 32, the following steps are carried out to deposit the second and third layers 5, 6 while ensuring the interconnection between the two cells 30:
- the second layer 5 is deposited by electrodeposition, over the non-perforated portions of the first layer 4 (FIG. 10*b* and FIG. 12*d*), this step is facilitated because the first layers 4 of all the cells are electrically connected together thanks to electrical contact 42;
- the first and second layers 4, 5 are engraved so as to cut the electrical contact 42 between the cells 30, at the ends of the separating strips 32 (FIG. 12*e*);
- the second layer 5 is directly engraved (FIGS. 10*c*, 12*f* and 12*g*), in particular according to a technique called scribing technique, over one or several cell(s) 30, along an edge of the concerned separating strip 32 (left edge in FIGS. 10*c*, 12*f* and 12*g*), along a given width, laying bare strips 40 of the first layer 4 of the cells 30, these strips 40 being parallel to the separating strips 32 (in FIG. 12*f* only the strips 40 between the cells on the left and on the right are illustrated, but not those between the cells on the top and on the bottom);
- the third layer 6, which thus covers the second layer 5 in a uniform manner, is deposited by evaporation, the bare strips 40 to the first layer 4 of the first cell 30, the perforations 31 and the separating strips 32 (FIGS. 10*d*, 12*h* and 12*i*—the third layer 6 not illustrated in the perforations 31 in FIGS. 12*h* to 12*k* for clarity), so that an electrical contact is made between the strips 40 and the third layer 6, but with, short-circuits at the cells 30; the third layer 6 is directly engraved, in particular according to a technique called scribing technique, so as to cut the aforementioned short-circuits established in the cells 30 on their respective strips 40 (FIGS. 10, 12j and 12k), by engraving strips 60 over this third layer 6 so as to lay bare a portion of the strips 40 of the first layer 4 of the cells 30 (cutting the electrical contact between the first and the third layers 4, 6 within the same cell 30), while keeping an electrical contact between the strips 40 of a cell and the third layer 6 of the adjacent cell, thereby establishing the series connection between the cells 30.

Figure 12D:
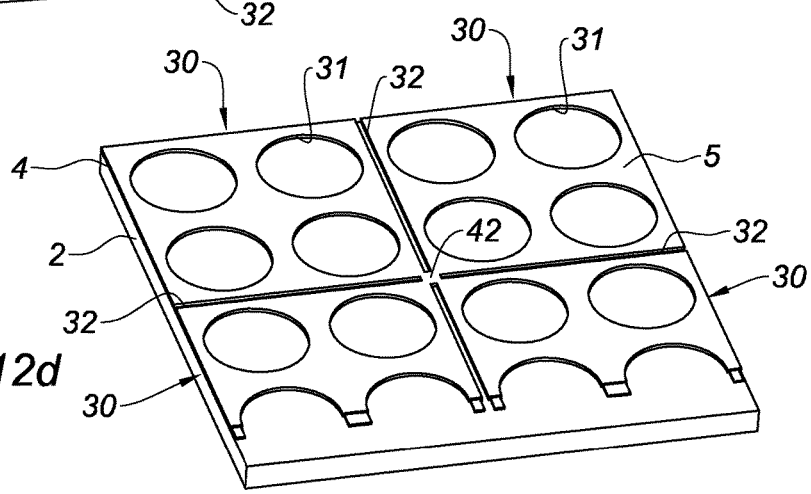
Figure 12E:
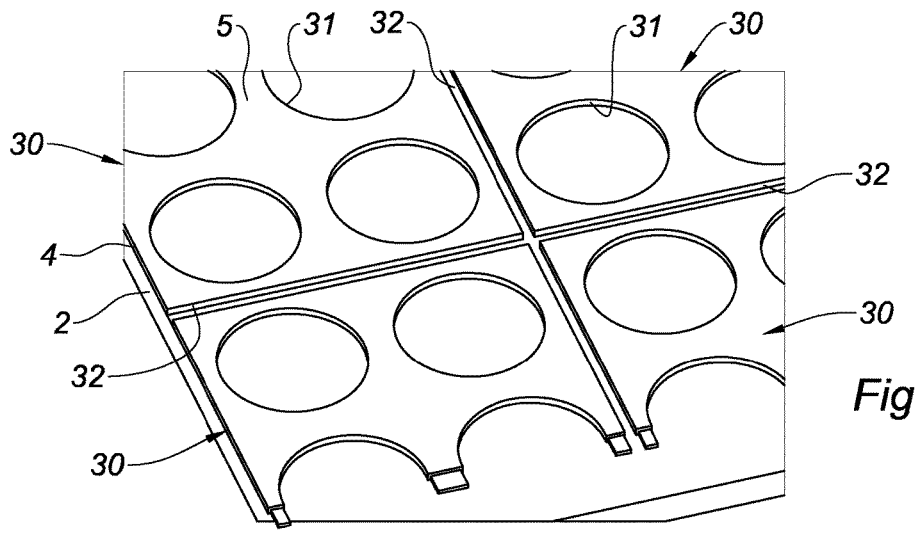
Figure 12F:
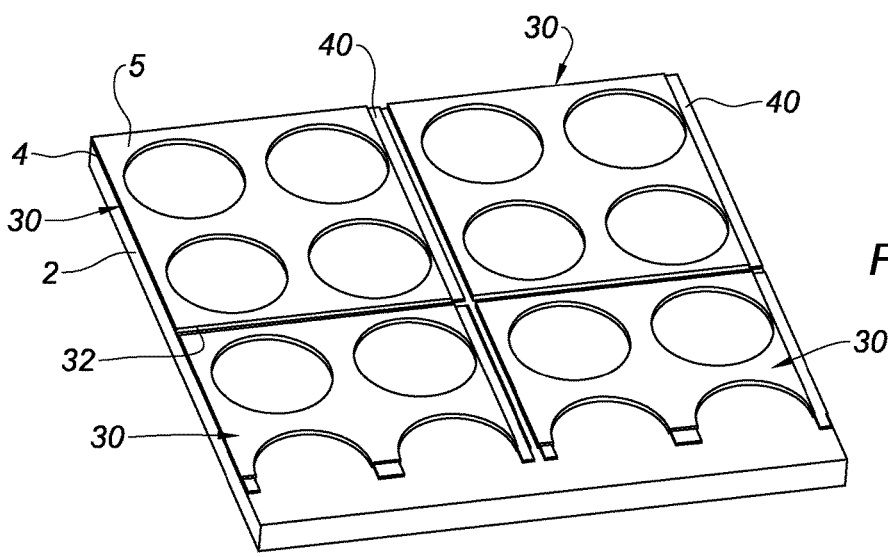
Figure 12G:
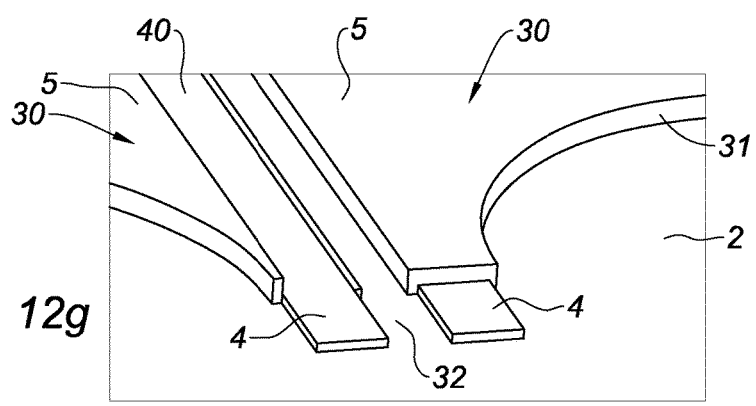
Figure 12H:
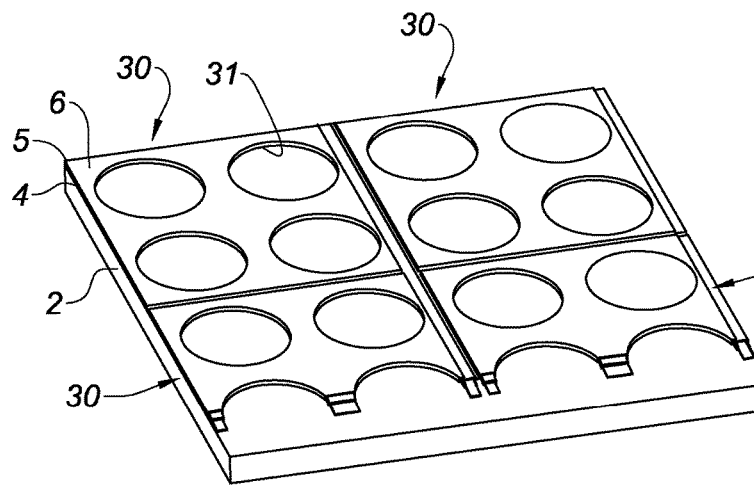
Figure 12I:
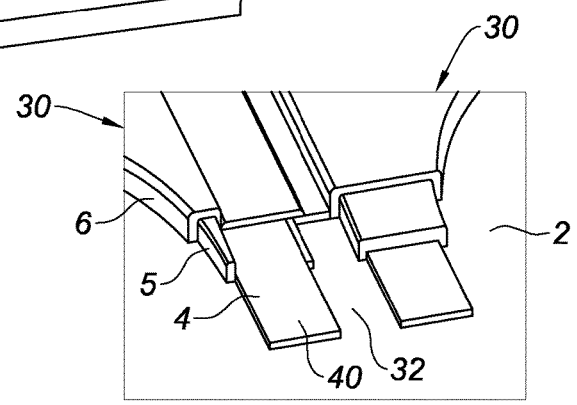
Figure 12J:
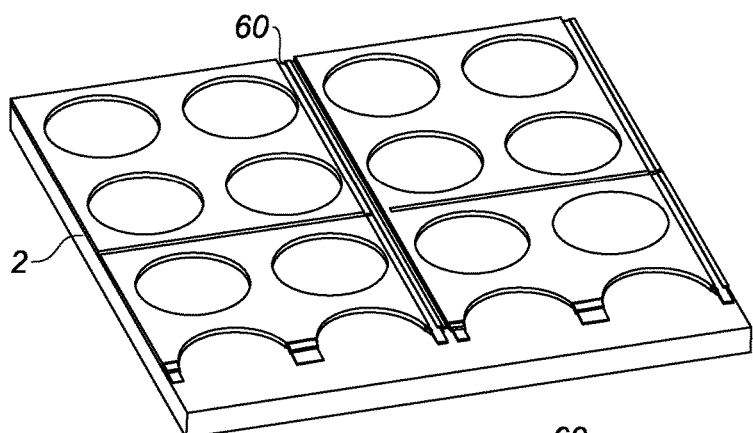
Figure 12K:
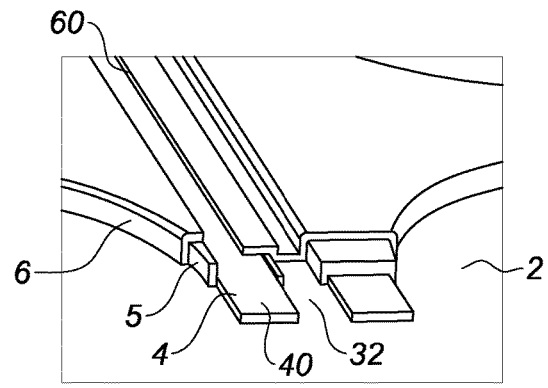

It is to be noted that, if the second layer 5 is deposited by evaporation or spraying (instead of the deposition by electrodeposition illustrated in FIGS. 10b and 12d), it is no longer necessary to ensure the prior electrical contact 42 between the cells 30. Thus, in this case, the secondary areas 82 of the mask 8 can be joined.

FIG. 11 illustrates an improvement of the steps of FIG. 8 focusing on sub-steps intended to ensure the interconnection between two adjacent cells 30, in other words the electrical connection between the first layer 4 of a cell 30 and the third layer 6 of an adjacent cell 30.

FIG. 11a illustrates a substrate 2 over which a positive mask 8 has been deposited presenting main 81 and secondary 82 areas, and over which a first layer 4 has been deposited afterwards in a uniform manner, by spraying or by evaporation.

Starting from the situation of FIG. 11a, the following steps are carried out to deposit the second and third layers 5, 6, while ensuring the interconnection between two cells 30:

- a second layer 5 is deposited in a uniform manner, by spraying or by evaporation (FIG. 11b);
- a third layer 6 is deposited in a uniform manner, by spraying or by evaporation (FIG. 11c);
- the mask 8 is chemically eliminated, leaving over the substrate 2 only but the first, second and third layers 4, 5, 6 presenting the positive perforations 31 of the main areas 81 and the positive separating strips 32 of the secondary areas 82 (FIG. 11d);
- the second and third layers 5, 6 are directly engraved, in particular according to a technique called scribing technique, along an edge of the separating strip 32, along a given width (left edge in FIG. 11e), in order to lay bare a strip 41 of the first layer 4 of the first cell 30, this strip 41 being parallel to the separating strip 32 (FIG. 11e);
- there is provided, in the separating strip 32, an electrical switch 33 which comprises a conductive portion 34 establishing contact between the strip 41 and the third layer 6 of the second cell 30 and an insulating portion 35 interposed between the first layers 4 of the two cells 30, thereby establishing the series connection between the two cells 30.

The following description is about the geometric conformation of the perforations 31, in particular with reference to FIGS. 2a, 2b, 3a and 3b.

Advantageously, the perforations 31 are distributed over the surface of each cell 30 according to a virtual paving composed of a plurality of elementary photovoltaic units, juxtaposed without void and without encroachment so as to define the corresponding cell 30. The principle is thus to define one or several basic pattern(s), defining one or several elementary unit(s), which will be repeated so as to entirely pave each cell 30, so that when managing transparency at the microscopic level (with the elementary units) transparency is managed at the macroscopic level (at the cell).

Each elementary unit is in the form of a geometric portion of the photovoltaic film 3, the dimensions of which in the main plane are comprised between 15 nanometers and 800 micrometers, delimited by a virtual outline (the outline of the pattern) and to which there is associated at least one perforation arranged in whole or in part inside said outline (the perforated surface in the elementary unit microscopically defining the perforated surface of the cell), each perforation being associated to one single elementary unit.

Each elementary unit presents a perforated surface, corresponding to the surface of the perforation(s) associated to the elementary unit in the main plane, which is comprised between 10 and 90% of the total surface of the elementary unit in this same main plane, preferably between 30 and 70%.

By working with a mask 8, paving of the elementary units is managed by managing paving of the above described main areas 81.

FIGS. 2a, 2b, 3a and 3b illustrate positive masks 8 presenting circular-shaped main areas 81 (other shapes may of course be considered) distributed according to predefined paving.

With a positive mask 8, the main areas 81 of the mask 8 are distributed over the surface of each cell 30 according to a virtual paving composed of a plurality of patterns juxtaposed without void and without encroachment, each pattern being delimited by a virtual outline to which there is associated at least one main area 81 located in whole or in part inside said outline.

The pattern forms the smallest geometric element that allows constructing the mask 8 at a macroscopic scale by applying a given algorithm to this pattern (mainly a translation along two directions, a symmetry and a rotation), while integrating that the pattern should preferably offer the least interaction with the physiological mechanisms of the vision, and contribute to the best perceived uniformity of the photovoltaic device as well as to the best visual comfort.

Furthermore, it is important to note the following definition: the resolution of the mask 8 characterizes the smallest dimension of the basic pattern. However, the resolution has no impact on the level of transparency or on the energy efficiency of the photovoltaic film, but it may influence the way the eye perceives the transparency of this photovoltaic film and thus this resolution constitutes a potential factor of visual comfort or discomfort. In particular, the resolution intervenes on the perceived uniformity of the photovoltaic film, and the finest the resolution is, the more the perception of uniformity will be important.

In the implementation of a method for printing the mask 8, it is to be noted that the resolution of the mask 8 is still downwardly limited by the used printing technique. As an illustration, if the printing method presents an intrinsic resolution of 300 points per inch for drawing the pattern, this means that the basic printed point is in the order of at least 85 micrometers, so that such a printing method will not allow drawing patterns that are smaller than 100 micrometers. Hence, the intrinsic resolution of the method for printing the mask 8 automatically conditions the final resolution of the mask 8.

In a first embodiment of the mask 8 illustrated in FIG. 2a, a periodic paving called orthogonal or square periodic paving is implemented, from a pattern consisting of a concentric disc (the main area 81) centered inside a square (the virtual outline); the pattern being repeated by translation along axes parallel to the sides of the square, thereby creating alignments of the disk according to these two axes.

In a second embodiment of the mask 8 illustrated in FIG. 2b, a periodic paving called staggered or honeycomb periodic paving is implemented, from a pattern consisting of a concentric disc (the main area 81) centered inside a hexagon (the virtual outline); the pattern being repeated by translation parallel to the sides of the hexagon so that the disks 81 of a line (or of a column) are placed in a staggered manner relative to those of the preceding line (or column).

In order to avoid having periodic patterns which could reduce the visual comfort of the photovoltaic film, it may be considered to proceed with a non-periodic paving of the plane.

In a third embodiment of the mask 8 illustrated in FIG. 3a, a non-periodic paving called "pinwheel" non-periodic paving is implemented. This paving is made from a pattern composed of a concentric disc (the main area 81) located inside a right-angled triangle (the virtual outline) the catheti of which are in a ratio of two. The "pinwheel" paving, developed by the British mathematician John Conway, is based on a decomposition of the considered triangle into five homothetic triangles from an original triangle, by the implementation of symmetries, translations and rotations.

In a fourth embodiment of the mask 8 illustrated in FIG. 3b, a non-periodic paving of the random-type is implemented.

This random paving constitutes a variant of the periodic paving exposed above, with the aim of breaking periodicity, that is to say not obtaining parallel and regularly distributed disk lines; the principle being to scramble the distribution of the disks so that the eye cannot catch on any regular structure.

However, this random paving should comply with some constraints and statistical properties.

The first constraint consists in that the paving of patterns should ensure a constant level of transparency which is independent of the considered scale (unless, of course, falling below the basic pitch). In other words, this random paving should not lead to obtain too significant transparent or opaque areas so that the overall rendering is relatively uniform.

The second constraint comprises keeping a minimum distance between two neighboring disks 81, so as to be able to guarantee a deposition of the first layer 4 with a minimum width (depending on the capabilities of the printing technology of the mask 8 and/or the deposition technology of the thin layers) between two perforations 31.

In general, other shapes of the main areas 81 may be considered, not only the disk shape, as for example elliptical, rectanglar shapes, etc. The use of these other shapes might turn out to be interesting in particular for non-periodic paving, where the orientation of the basic pattern varies. As an example, an elliptical-shaped main area in a "pinwheel" paving would allow to access higher levels of transparency and contribute to visually scramble the pattern by varying the angle of the focal axis of the ellipse with the horizontal.

Furthermore, it may be considered to vary the dimensions of the main areas 81 over the substrate, in order to offer a gradient effect, for example, with a transparency that gradually increases from the bottom to the top or from the right to the left over the substrate.

Of course the aforementioned example of implementation is in no way limiting and other improvements and details can be brought to the photovoltaic device according to the invention, without departing from the scope of the invention where other pattern shapes can, for example, be made.

The invention claimed is:

1. A method for manufacturing a thin-layer photovoltaic device, comprising the following steps:
   a substrate is provided;
   a photovoltaic film is placed over a substrate by the superposition of layers comprising at least a first layer which is a conductive layer forming a rear electrical contact, a second layer which is a photoactive layer absorbing in the solar spectrum based on inorganic material, and a third layer which is a layer made of transparent conductive material forming a front electrical contact;
   the photovoltaic film is divided into a plurality of individual and interconnected photovoltaic cells, wherein each photovoltaic cell is connected in series or in parallel with one or several adjacent photovoltaic cells within the plurality of photovoltaic cells and is electrically insulated from the other adjacent photovoltaic cells within the plurality of photovoltaic cells,
   wherein, upon placing the photovoltaic film, a plurality of individual perforations passing through at least the first layer and the second layer of the photovoltaic film in each photovoltaic cell is arranged, by the application of a mask according to a printing method, said mask presenting main areas defining a positive or a negative stencil of said plurality of individual perforations, wherein the plurality of individual perforations is arranged in compliance with the following geometric characteristics:
   each perforation presents dimensions in the main plane comprised between 10 nanometers and 400 micrometers,
   each perforation is distant from the nearest adjacent perforation by a distance comprised between 5 nanometers and 400 micrometers,
   each photovoltaic cell presents a perforated surface, corresponding to the surface of the perforations disposed in said photovoltaic cell in the main plane, which is comprised between 10 and 90% of the total surface of the photovoltaic cell in this same main plane.

2. The method according to claim 1, wherein:
   the mask is deposited over the substrate, said mask forming a positive stencil of the plurality of individual perforations;
   the first layer, which covers the mask and the bare areas of the substrate, is deposited in a uniform manner.

3. The method according to claim 2, wherein, following the deposition of the first layer, the mask is eliminated, leaving over the substrate only but the first layer presenting positive perforations of the mask.

4. The method according to claim 3, wherein the following steps are carried out:
   the second layer is deposited on the non-perforated portions of the first layer;
   the third layer is deposited.

5. The method according to claim 2, wherein, following the deposition of the first layer:
   the second layer, which covers the first layer, is deposited in a uniform manner;
   the third layer, which covers the second layer, is deposited in a uniform manner;
   the mask is eliminated, leaving over the substrate the photovoltaic film presenting positive perforations of the mask.

6. The method according to claim 1, wherein the following steps are carried out:

the perforations are arranged in the first layer by means of the mask;
the second layer is deposited over the non-perforated portions of the first conductive layer;
the third layer is deposited.

7. The method according to claim 1, wherein:
the first layer is uniformly deposited over the substrate;
a photosensitive resin layer is deposited over the first layer;
the mask is deposited over the photosensitive resin layer, said mask forming a positive stencil of the plurality of individual perforations;
the photosensitive resin layer is insolated by applying a luminous radiation through the previously deposited mask;
photosensitive resin layer that have not been exposed to the luminous radiation and corresponding to the areas of the photosensitive resin layer that have been masked by the mask, are eliminated, laying bare areas of the first layer and leaving in place islets of insolated resin;
the areas of the first layer that have been laid bare, between the islets of insolated resin, are eliminated, thereby forming through orifices in said first conductive layer;
the islets of insolated resin remaining on the first layer are eliminated, leaving over the substrate only but the first layer presenting positive perforations of the mask.

8. The method according to claim 1, wherein:
a photosensitive resin layer is deposited over the substrate;
the mask is deposited over the photosensitive resin layer, said mask forming a negative stencil of the plurality of individual perforations;
the photosensitive resin layer is insolated by applying a luminous radiation;
the areas of the photosensitive resin layer that have not been exposed to the luminous radiation and corresponding to the areas of the photosensitive resin layer that have been masked by the mask, are eliminated, laying bare areas of the substrate and leaving in place islets of insolated resin;
the first layer, which covers the remaining islets of insolated resin and the areas of the substrate that have been laid bare, is deposited in a uniform manner.

9. The method according to claim 8, wherein, following the deposition of the first layer, the remaining islets of insolated resin are eliminated, leaving over the substrate only but the first layer presenting negative perforations of the mask.

10. The method according to claim 8, wherein, following the deposition of the first layer:
the second layer, which covers the first layer, is deposited in a uniform manner;
the third layer, which covers the second layer, is deposited in a uniform manner;
the remaining islets of insolated resin are eliminated, leaving over the substrate the photovoltaic film presenting negative perforations of the mask.

11. The method according to claim 1, wherein the mask presents secondary areas defining a positive or a negative of separating strips between the cells of the photovoltaic film.

12. The method according to claim 1, wherein the first layer is an opaque metallic layer.

13. The method according to claim 1, wherein the mask is applied according to a printing method of the type material jet digital printing, flexography, screen-printing, or pad-printing.

14. The method according to claim 6, wherein the second layer is deposited on the non-perforated portions of the first layer by electro deposition.

15. The method according to claim 6, wherein the third layer is deposited by evaporation.

16. The method according to claim 1, wherein the perforated surface of each photovoltaic cell is comprised between 30 and 70 percent of the total surface of the photovoltaic cell.

17. A method for manufacturing a thin-layer photovoltaic device, comprising the following steps:
a substrate is provided;
a photovoltaic film is placed over a substrate by the superposition of layers comprising at least a first layer which is a conductive layer forming a rear electrical contact, a second layer which is a photoactive layer absorbing in the solar spectrum based on inorganic material, and a third layer which is a layer made of transparent conductive material forming a front electrical contact;
the photovoltaic film is divided into a plurality of individual and interconnected photovoltaic cells, wherein each photovoltaic cell is connected in series or in parallel with one or several adjacent photovoltaic cells within the plurality of photovoltaic cells and is electrically insulated from the other adjacent photovoltaic cells within the plurality of photovoltaic cells,
wherein, upon placing the photovoltaic film, a plurality of individual perforations passing through at least the first layer and the second layer of the photovoltaic film in each photovoltaic cell is arranged, by the application of a mask according to a printing method, said mask presenting main areas defining a positive or a negative stencil of said plurality of individual perforations, wherein:
the mask is deposited over the substrate, said mask forming a positive stencil of the plurality of individual perforations;
the first layer, which covers the mask and the bare areas of the substrate, is deposited in a uniform manner.

18. A method for manufacturing a thin-layer photovoltaic device, comprising the following steps:
a substrate is provided;
a photovoltaic film is placed over a substrate by the superposition of layers comprising at least a first layer which is a conductive layer forming a rear electrical contact, a second layer which is a photoactive layer absorbing in the solar spectrum based on inorganic material, and a third layer which is a layer made of transparent conductive material forming a front electrical contact;
the photovoltaic film is divided into a plurality of individual and interconnected photovoltaic cells, wherein each photovoltaic cell is connected in series or in parallel with one or several adjacent photovoltaic cells within the plurality of photovoltaic cells and is electrically insulated from the other adjacent photovoltaic cells within the plurality of photovoltaic cells,
wherein, upon placing the photovoltaic film, a plurality of individual perforations passing through at least the first layer and the second layer of the photovoltaic film in each photovoltaic cell is arranged, by the application of a mask according to a printing method, said mask presenting main areas defining a positive or a negative stencil of said plurality of individual perforations, wherein:
the first layer is uniformly deposited over the substrate;

a photosensitive resin layer is deposited over the first layer;

the mask is deposited over the photosensitive resin layer, said mask forming a positive stencil of the plurality of individual perforations;

the photosensitive resin layer is insolated by applying a luminous radiation through the previously deposited mask;

photosensitive resin layer that have not been exposed to the luminous radiation and corresponding to the areas of the photosensitive resin layer that have been masked by the mask, are eliminated, laying bare areas of the first layer and leaving in place islets of insolated resin;

the areas of the first layer that have been laid bare, between the islets of insolated resin, are eliminated, thereby forming through orifices in said first conductive layer;

the islets of insolated resin remaining on the first layer are eliminated, leaving over the substrate only but the first layer presenting positive perforations of the mask.

19. A method for manufacturing a thin-layer photovoltaic device, comprising the following steps:

a substrate is provided;

a photovoltaic film is placed over a substrate by the superposition of layers comprising at least a first layer which is a conductive layer forming a rear electrical contact, a second layer which is a photoactive layer absorbing in the solar spectrum based on inorganic material, and a third layer which is a layer made of transparent conductive material forming a front electrical contact;

the photovoltaic film is divided into a plurality of individual and interconnected photovoltaic cells, wherein each photovoltaic cell is connected in series or in parallel with one or several adjacent photovoltaic cells within the plurality of photovoltaic cells and is electrically insulated from the other adjacent photovoltaic cells within the plurality of photovoltaic cells, wherein, upon placing the photovoltaic film, a plurality of individual perforations passing through at least the first layer and the second layer of the photovoltaic film in each photovoltaic cell is arranged, by the application of a mask according to a printing method, said mask presenting main areas defining a positive or a negative stencil of said plurality of individual perforations, wherein:

a photosensitive resin layer is deposited over the substrate;

the mask is deposited over the photosensitive resin layer, said mask forming a negative stencil of the plurality of individual perforations;

the photosensitive resin layer is insolated by applying a luminous radiation;

the areas of the photosensitive resin layer that have not been exposed to the luminous radiation and corresponding to the areas of the photosensitive resin layer that have been masked by the mask, are eliminated, laying bare areas of the substrate and leaving in place islets of insolated resin;

the first layer, which covers the remaining islets of insolated resin and the areas of the substrate that have been laid bare, is deposited in a uniform manner.

\* \* \* \* \*